United States Patent
Boos et al.

(10) Patent No.: US 7,545,232 B2
(45) Date of Patent: Jun. 9, 2009

(54) POLAR MODULATOR ARRANGEMENT AND POLAR MODULATION METHOD

(75) Inventors: Zdravko Boos, München (DE); Benjamin Lindner, Linz (AT); Thomas Mayer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 11/766,855

(22) Filed: Jun. 22, 2007

(65) Prior Publication Data

US 2008/0317169 A1 Dec. 25, 2008

(51) Int. Cl.
*H03C 3/38* (2006.01)
(52) U.S. Cl. ............... 332/145; 332/144; 332/146; 332/159
(58) Field of Classification Search ......... 332/144–146, 332/119, 124–128, 159
See application file for complete search history.

(56) References Cited

U.S. PATENT DOCUMENTS

| 7,184,951 B2* | 2/2007 | Royle et al. ............ 704/205 |
| 2007/0189431 A1* | 8/2007 | Waheed et al. ......... 375/376 |
| 2008/0219331 A1* | 9/2008 | Liang et al. ............ 375/219 |

OTHER PUBLICATIONS

"Digital-IF WCDMA Handset Transmitter IC in 0.25-μm SiGe BiCMOS", Vincent W. Leung, Lawrence E. Larson and Prasad S. Gudem, IEEE Journal of Solid-Stage Circuits, vol. 39, No. 12, Dec. 2004, pp. 2215-2225.

\* cited by examiner

*Primary Examiner*—Anh Q Tran
(74) *Attorney, Agent, or Firm*—Eschweiler & Associates, LLC

(57) ABSTRACT

A polar modulator arrangement has a first and a second node to receive a digital signal with a first and a second component corresponding to a digital amplitude component and a digital phase component. A digital interpolation filter generates an interpolated first component by interpolating and filtering the first component. A polar modulated radio frequency signal is generated by a combination element as a function of the interpolated first component and the second component.

34 Claims, 4 Drawing Sheets

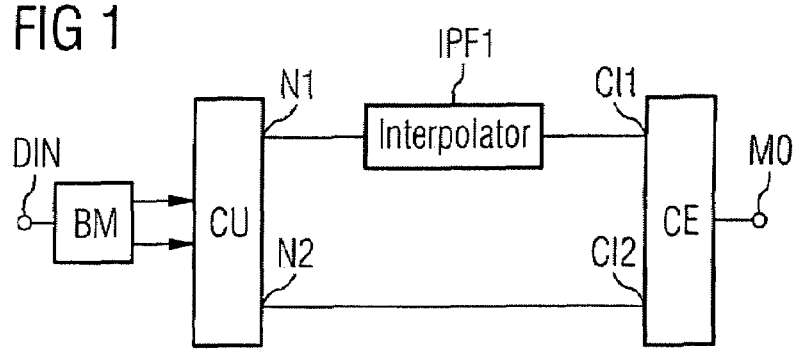
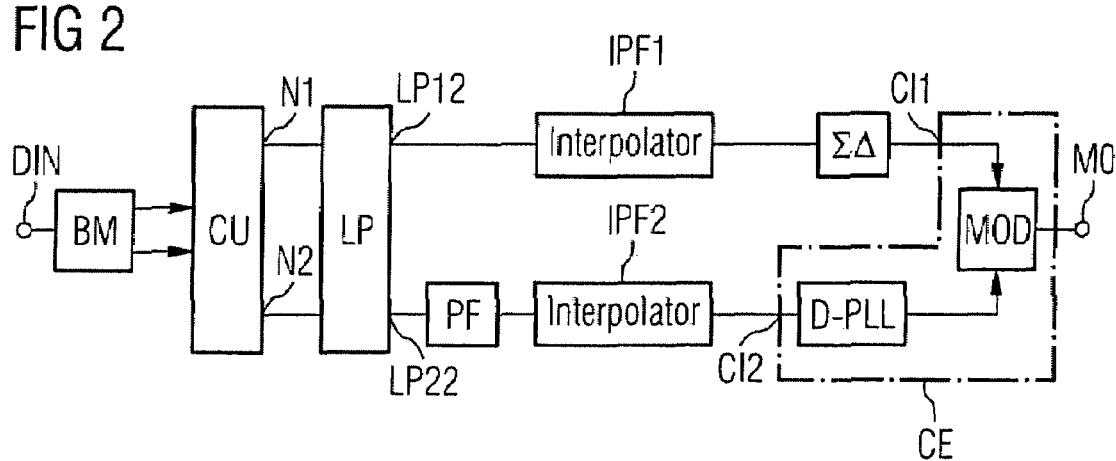
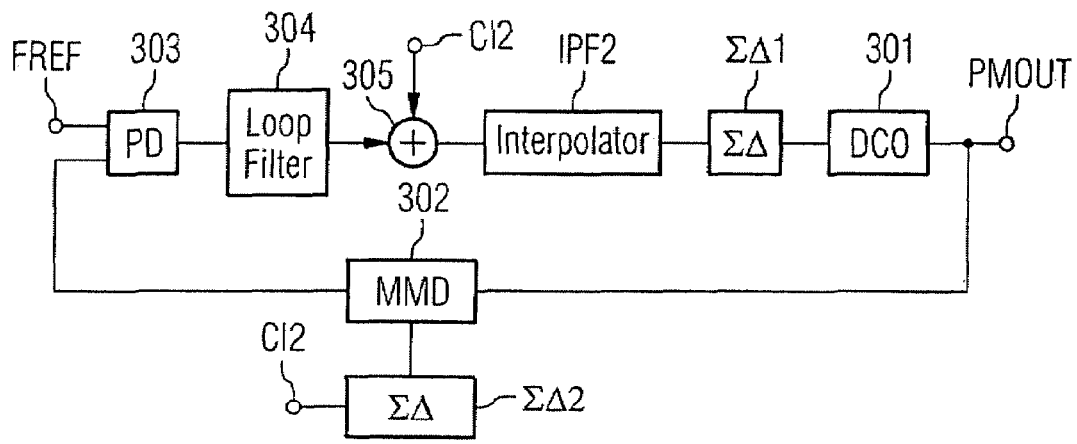

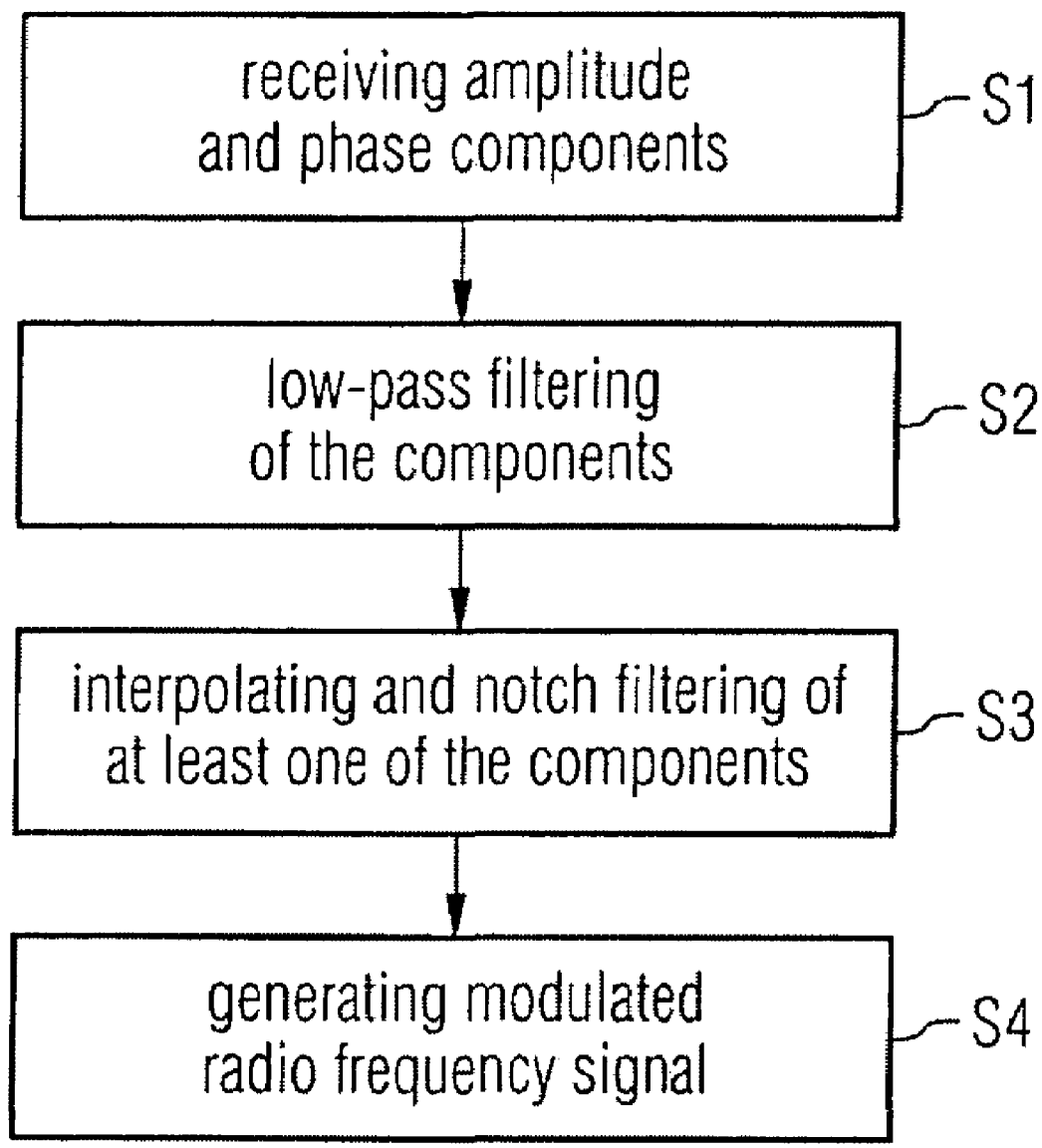

POLAR MODULATOR ARRANGEMENT AND POLAR MODULATION METHOD

BACKGROUND OF THE INVENTION

The requirements for the signal quality of modulators, for example in transmitting devices, become more stringent as need for high data rates and increasing mobility grows. In modern mobile radio standards, such as Universal Mobile Telecommunications System (UMTS), Wideband Code Division Multiple Access (WCDMA), Global System for Mobile Communication (GSM), Enhanced Data Rates for GSM Evolution (EDGE), Bluetooth Medium Data Rate, or Wireless Local Area Network (WLAN) according to 802.11a/b/g, special modulation types are required for data transmission which modulate both the phase and the amplitude of a carrier signal at the same time.

Simultaneous amplitude and phase modulation make it possible to achieve higher data transmission rates and thus better bandwidth efficiency. The mobile radio standards mentioned above envisage, for example, the use of quadrature phase shift keying (QPSK), 8-phase shift keying (8-PSK) or quadrature amplitude modulation (QAM) as modulation types for data transmission.

Depending on the selected application for the individual mobile radio standards, these high-quality modulation types are used not only for data transmission from a base station to a mobile communication appliance but also from the mobile communication appliance to the base station.

The modulation types which are used for modern mobile radio standards are particularly sensitive to possible interference or distortion which is produced by various components in a transmission path. Additionally, the much more sophisticated multi-band operation and modulation formats in advanced wireless communication systems specify highly strict and difficult requirements for out-of-band emissions and spurious emissions. For example, in UMTS systems, it can be necessary to provide a radio frequency filter like a surface acoustic wave (SAW) filtering device before or after the final power amplifier in a transmission path to meet given requirements. Such radio frequency filters use a certain amount of area on a printed circuit board (PCB) and therefore increase the cost of a transmitter device.

A modulation can be performed using a vector modulation in which data to be transmitted is provided with an in-phase component and a quadrature component which form a complex signal. In other systems, also a polar modulator can be used in which the data are coded as polar coordinates with an amplitude component and a phase component. The amplitude component is usually digital analog converted and used for an amplitude modulation of a carrier signal which comprises the phase information of the phase component. A bandwidth of amplitude and phase components is usually expanded compared to the bandwidth of in-phase and quadrature components of a vector modulation.

With the use of a polar modulator or a polar transmitter, some of the radio frequency filtering efforts can be reduced. Nevertheless, there can be a need to implement a radio frequency filter also for conventional polar modulators to fulfill the out-of-band and spurious emission requirements specified by advanced mobile radio standards.

For example, through the digital processing of the data to be transmitted, the amplitude component and the phase component, a repetition spectrum can be introduced into the digital signals. The repetition spectrum is usually filtered using analogue reconstruction filters to meet the given requirements. A frequency of the repetition spectrum depends on the clock frequency used in the digital processing.

BRIEF DESCRIPTION OF THE DRAWINGS

The invention is explained in detail below using exemplary embodiments with reference to the drawings in which FIG. 1 is a first exemplary embodiment of a polar modulator arrangement, FIG. 2 is a second exemplary embodiment of a polar modulator arrangement, FIG. 3 is an embodiment of a phase-locked loop, FIG. 9 is a second exemplary embodiment of a combination element and FIG. 10 is a flow chart diagram illustrating a polar modulation method.

DETAILED DESCRIPTION OF THE INVENTION

Figure 4:
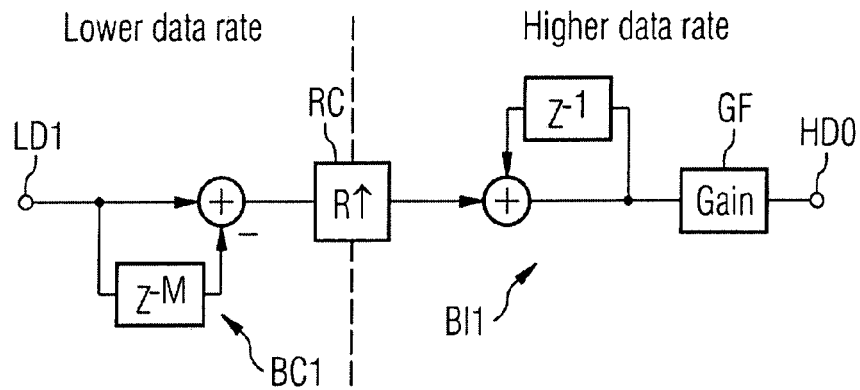
FIG. 4 is a first embodiment of a digital interpolation filter.

In the following description further aspects and embodiments of the present invention are summarized. In addition, reference is made to the accompanying drawings, which form a part hereof, and in which is shown by way of illustration, one or more embodiments in which the invention may be practiced. The embodiments of the drawings present a summary in order to provide a better understanding of one or more aspects of the present invention. This summary is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

FIG. 1 shows an exemplary embodiment of a polar modulator arrangement. It comprises a base-band modulation unit BM which on its input side is coupled to a data input DIN. A conversion unit CU is coupled to the base-band modulation unit BM and comprises a first and a second node N1, N2. A combination element CE comprises a first combination input CI1 which is coupled to the first node N1 via a digital interpolation filter IPF1. The combination element CE further comprises a second combination input CI2 which is coupled to the second node N2. An output of the combination element CE forms a modulator output MO.

Data to be transmitted in a transmission path or to be modulated, respectively, are received at the data input DIN. The base-band modulation unit BM performs a modulation of the input data and generates a digital signal comprising an in-phase component and a quadrature component which is provided to the conversion unit CU. In the conversion unit CU, a further digital signal comprising polar components, i.e. an amplitude component and a phase component is generated from the in-phase component and the quadrature component.

The conversion unit CU can, for example, comprise a Coordinate Rotation Digital Computer (CORDIC) to perform the conversion from the vector components to the polar components. In an alternative embodiment, the base-band modulation unit BM can be comprised by the conversion unit CU such that the conversion unit CU derives the amplitude component and the phase component as a function of the input data to be modulated which are provided at the data input DIN.

The conversion unit CU provides the amplitude component and the phase component as a first component at the first node N1 and a second component at a second node N2. The first component can be the amplitude component such that the second component is the phase component. In an alternative embodiment, the first component is the phase component and the second component is the amplitude component.

A processing of the amplitude component and the phase component, for example within the conversion unit CU is performed corresponding to a first data rate. In one embodiment the digital signal processing is performed at a clock frequency of 26 MHz which is provided by a standard crystal oscillator. In other embodiments also other clock frequencies can be used such as multiples of 26 MHz like 104 MHz.

In other words, the first and the second component are provided at the first and the second node N1, N2 with said first data rate.

In this embodiment, the first component is provided to the digital interpolation filter IPF1 which performs an interpolating and a filtering of the first component. The filtering can comprise a notch filtering, wherein the notch frequency of the notch filtering depends on the clock frequency of the digital signal processing in the conversion unit CU or on the first data rate respectively. Through the interpolating performed within the digital interpolation filter IPF1, the first component is additionally interpolated, that means transformed to a higher, second data rate. Accordingly, a data rate of an interpolated first component provided at the output of the digital interpolation filter IPF1 is higher than a data rate of the first component at the input of the digital interpolation filter IPF1.

Through the notch filtering and the interpolation of the first component, a repetition spectrum within the first component, that means frequency portions at frequencies being multiples of a processing frequency, can be attenuated or removed. Therefore a signal quality of the first component which can be both an amplitude component and a phase component can be increased. The interpolated digital first component and the digital second component are provided to the combination element CE which is configured to generate a polar modulated radio frequency signal as a function of said interpolated first component and said second component. The polar modulated radio frequency signal is provided at the modulation output MO.

FIG. 2 shows another embodiment of a polar modulator arrangement. In this embodiment a low-pass filter element LP is coupled to the first and to the second node N1, N2. A first digital interpolation filter IPF1 is coupled to a first output LP12 of the low-pass filter element which in this embodiment provides a digital amplitude component. A phase to frequency converter PF is coupled to a second output LP22 of the low-pass filter element LP to receive the digital phase component and perform a phase to frequency conversion of the phase component. For example the phase-to-frequency converter PF comprises a time deriving element, mathematically expressed by d/dt. A second digital interpolation filter IPF2 is coupled to an output of the phase-to-frequency converter PF. The first and the second digital interpolation filter IPF1, IPF2 each perform a filtering and an interpolation of the respective digital components at their inputs, as described for the embodiment shown in FIG. 1.

Accordingly, the first digital interpolation filter IPF1 provides an interpolated first component corresponding to the digital amplitude component and the second digital interpolation filter IPF2 provides an interpolated second component corresponding to a digital phase component.

The polar modulator arrangement shown in FIG. 2 further comprises a Sigma-Delta-Modulator $\Sigma\Delta$ coupling the output of the first digital interpolation filter IPF1 to the first combination input CI1 of the combination element CE. The combination element CE comprises a digital phase-locked loop D-PLL which on its input side is coupled to the second combination input CI2 and to the output of the second digital interpolation filter IPF2 respectively. The combination element CE further comprises a modulation element MOD coupled to the first combination input CI1 and to an output of the digital phase-locked loop D-PLL.

The digital phase-locked loop D-PLL generates a phase- or frequency-modulated radio frequency signal depending on the interpolated digital phase component. The phase- or frequency-modulated radio frequency signal can be regarded as a modulated carrier signal. The phase-locked loop D-PLL can comprise elements widely known in the art like a reference clock input, a time-to-digital converter, a loop filter and a digitally or voltage controlled oscillator.

The second digital interpolation filter IPF2 can be combined with or included within the digital phase-locked loop D-PLL in various embodiments.

In another embodiment, the digital phase-locked loop D-PLL can also be replaced by an analogue phase-locked loop having respective means for processing the interpolated digital phase component.

The digital phase-locked loop can comprise one or more Sigma-Delta-Modulators for providing the interpolated digital phase component as modulation data to the one or more modulation inputs of the digital phase-locked loop.

The modulation unit MOD performs a modulation of the Sigma-Delta modulated and interpolated amplitude component with the modulated radio frequency signal provided by the phase-locked loop D-PLL to generate the polar modulated radio frequency signal at the modulation output MO.

In another embodiment, the low-pass filter element LP can also be arranged after the first and the second interpolation filter IPF1, IPF2, thus filtering the interpolated amplitude and phase component.

FIG. 3 shows an embodiment of a digital phase-locked loop which can be used within the embodiments of FIGS. 1 and 2. It comprises a digitally controlled oscillator (DCO) 301 for providing the phase- or frequency-modulated radio frequency signal at a signal output PMOUT. A multi-modulus frequency divider (MMD) 302 is coupled to said signal output PMOUT on its input side. The frequency divider 302 comprises a control input coupled to a Sigma-Delta Modulator $\Sigma\Delta 2$ which performs a noise shaping of the modulation data at the combination input CI2, wherein the modulation data are formed by the phase component. An output of the frequency divider 302 is coupled to a first input of a phase detector (PD) 303 which can comprise a time-to-digital converter. A second input of the phase detector 303 is coupled to a reference clock input FREF. An output of the phase detector 303 is coupled to a loop filter 304.

A summation element 305 is coupled to an output of the loop filter 304 and to the combination input CI2 as a second modulation input of the phase-locked loop for receiving the phase component. An output of the summation element 305 is coupled to the second interpolation filter IPF2 which on its output side is coupled to a further Sigma-Delta noise shaper ΣΔ1. The input of the digitally controlled oscillator 301 is coupled to an output of the Sigma-Delta Modulator ΣΔ1.

In this embodiment the phase-locked loop performs a two-point modulation of the phase component for generating the modulated carrier signal. To this end the control input of the frequency divider 302 forms a first modulation point and the summation element 305 forms a second modulation point. The control signal for the digitally controlled oscillator 301 which comprises the modulation information and depends on the phase component is interpolated and filtered within the second interpolation filter IPF2. Therefore a repetition spectrum in the control signal is attenuated or removed before the carrier signal is actually generated in the digitally controlled oscillator 301.

In various embodiments also a single point modulation can be performed, for example by omitting the summation element 305 or the second modulation point respectively. Also the use of Sigma-Delta noise shapers ΣΔ1 and ΣΔ2 is not mandatory.

FIG. 4 shows an embodiment of a digital interpolation filter which can be used for the first and the second digital interpolation filter IPF1, IPF2 shown in the embodiments of FIGS. 1, 2 and 3. The embodiment shown in FIG. 4 comprises a comb filter, especially a cascaded integrator-comb filter or CIC filter. The filter arrangement comprises a low-data rate input LDI, a first comb element BC1 coupled to the input LDI, an interpolator or rate changer RC, a first integrator element BI1 coupled to the output of the rate changer RC, a gain element GF and a high-data rate output HDO coupled to the gain element GF.

The comb element BC1 comprises a summation element coupled to the input LDI directly and via a delay element which provides an inverted and delayed version of a signal at the input LDI to the summation element, wherein the signal is delayed by M clock cycles corresponding to a lower-data rate of the comb element BC1. The digital output of the comb element BC1 is provided to the rate changer or interpolator RC which increases a data rate of the digital signal at its input by a factor of R. The interpolation is for example performed by introducing or inserting zeros between the digital values which are provided in a time discrete manner from the comb element BC1.

The interpolated digital signal is provided to the integrator element BI1 which comprises a summation element whose output is coupled to one of its inputs via a delay element. The delay element of the integrator element BI1 performs a delay of one clock cycle corresponding to the higher-data rate at the output of the interpolator RC. The output of the integrator element BI1 is weighted by a gain factor within the gain element GF and provided to the higher-data rate output HDO. The gain element GF can also be omitted in another embodiment.

In this embodiment, the integrator element BI1 is simply a single pole infinite impulse response (IIR) filter with a unity feedback coefficient. Accordingly, the comb element BC1 is a finite impulse response (FIR) filter. The delay parameter M of the comb element BC1 can be any positive value, but is usually limited to one or two. A gain factor in the gain element GF can be chosen such that a unity DC gain of the filter arrangement is achieved.

With the embodiment of the digital interpolation filter shown in FIG. 4, an interpolation and a notch filtering of the respective digital input signal can performed. In other words, the digital interpolation filter comprises an interpolator and a notch filter element. Thereby the filter parameters can be designed such that a notch frequency of the notch filter element depends on a data rate of the first component for attenuating frequency portions in a digital signal corresponding to an unwanted repetition spectrum.

Figure 5:
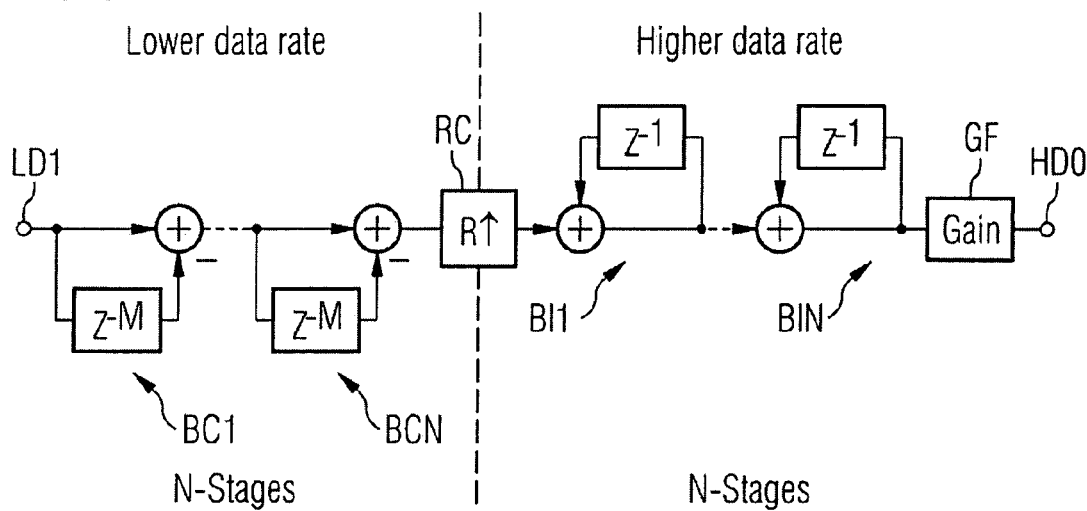
FIG. 5 is a second embodiment of a digital interpolation filter.

FIG. 5 shows another embodiment of a digital interpolation filter which also comprises a cascaded integrator comb filter. In this embodiment the filter arrangement comprises N stages of comb elements BC1 to BCN, wherein each of the comb elements BC1 to BCN has the same structure as the comb element BC1 described for the embodiment shown in FIG. 4. Accordingly, the filter arrangement comprises N stages of integrator elements BI1 to BIN, each being realized as a single pole IIR filter with a unity feedback coefficient as mentioned above.

In other words, the embodiment shown in FIG. 5 comprises several cascaded stages of comb elements BC1 to BCN followed by an interpolator RC and several cascaded stages of integrator elements BI1 to BIN.

Both the embodiments shown in FIGS. 4 and 5 can perform an interpolation and a notch filtering of respective digital signals at their inputs, wherein the digital signal can as well be an amplitude component as a phase component.

Figure 6:
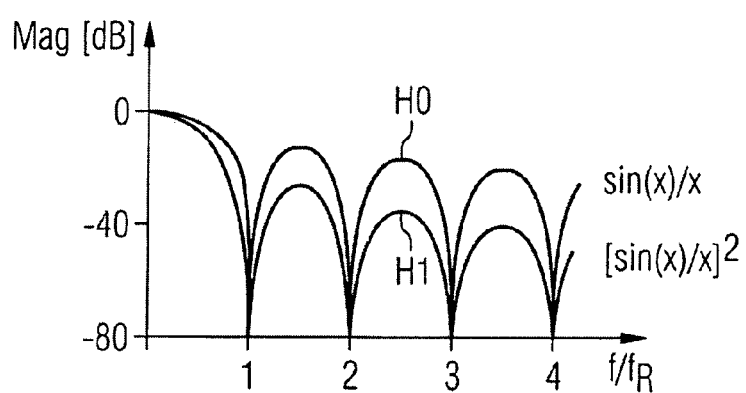
FIG. 6 is an exemplary frequency diagram of a digital interpolation filter.

FIG. 6 shows an exemplary frequency diagram of embodiments of digital interpolation filters like the ones shown in FIGS. 4 and 5. Depicted is a magnitude response MAG of the respective filter structures as a function of an input frequency. The frequency axis is normalized with respect to a repetition frequency $f_R$ at whose multiples of unwanted frequency portions generated by the digital signal processing are expected.

A frequency response H0 for example corresponds to the digital interpolation filter shown in FIG. 4 and comprises a $\sin(x)/x$ response, wherein integer multiples of the repetition frequency $f_R$ are attenuated. Accordingly, the frequency response H1 corresponds to a digital interpolation filter according to the embodiment of FIG. 5, wherein two stages of integrator elements and comb elements are implemented. In other words, the frequency response H1 corresponds to a cascaded integrator comb filter wherein the number N of stages is N=2. In this case the frequency response H1 is a $[\sin(x)/x]^2$ response. Also in this case integer multiples of the repetition frequency $f_R$ are attenuated.

In other words, a filter function of the notch filter element comprised by the digital interpolation filter depends on a $\sin(x)/x$ function. The filter function also depends on the number of stages N.

The number of stages N within the cascaded integrator comb filters can be different for the amplitude component and the phase component. For example the number of stages for the amplitude component is higher than the number of stages for the phase component, resulting in a difference of stages. In one embodiment said difference is one stage.

Figure 7:
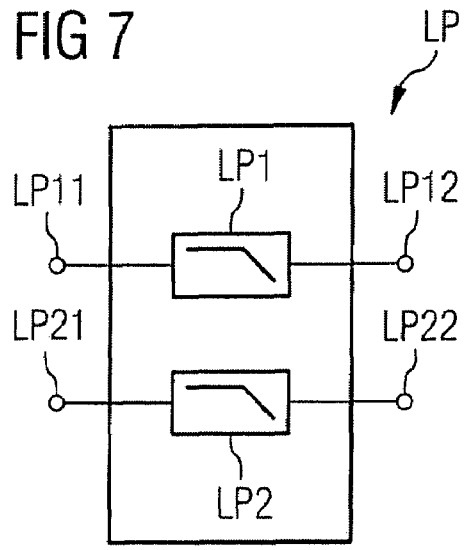
FIG. 7 is an exemplary embodiment of a low-pass filter element.

FIG. 7 shows an exemplary embodiment of a low-pass filter element LP. It comprises a first low-pass filter LP1 coupled between a filter input LP11 and a filter output LP12 and a second low-pass filter LP2 coupled between a further filter input LP21 and an output LP22. The low-pass filters LP1 and LP2 can have different cut-off frequencies, such that an amplitude component and a phase component are filtered differently. The low-pass filters LP1, LP2 are implemented as digital filters, wherein each of the low-pass filters LP1, LP2 can comprise several cascaded low-pass filters which result in a respective desired low-pass filter transfer function.

Figure 8:
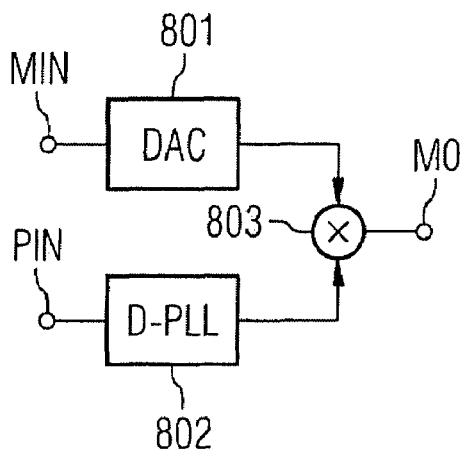
FIG. 8 is a first exemplary embodiment of a combination element.

FIG. 8 shows an embodiment of a combination element CE which can be used in the embodiments shown in FIGS. 1 and 2 for example. The arrangement of FIG. 8 comprises an amplitude input MIN and a phase input PIN, corresponding to the first and to the second combination input CI1, CI2. A digital-to-analog converter 801 is on its input side coupled to the amplitude input MIN. A digital phase-locked loop 802 is coupled to the phase input PIN. The outputs of the digital-to-analog converter 801 and the phase-locked loop 802 are coupled to a mixing device 803 which on its output side is coupled to the modulator output MO.

In this embodiment the digital-to-analog converter 801 generates an amplitude modulated signal as a function of a processed digital amplitude component. The phase-locked loop 802 generates a phase modulated or frequency modulated radio frequency signal as a function of a processed digital phase component. With reference to FIG. 3, the digital component at the phase input PIN can also be a frequency component which is generated by a phase-to-frequency converter as a function of a phase component. The amplitude modulated signal provided by the digital-to-analog converter 801 and the modulated carrier signal provided by the phase-locked loop 802 are mixed within the mixing device 803 to a polar modulated radio frequency signal.

Figure 9:
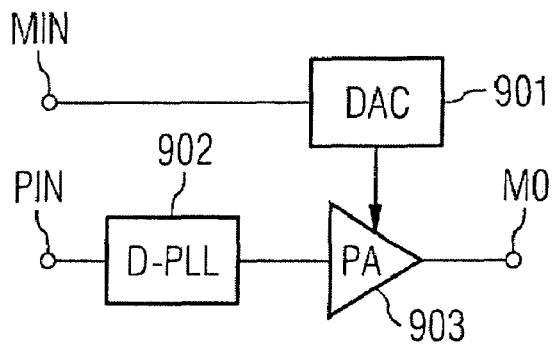

FIG. 9 shows another embodiment of a combination element CE which can be used in an embodiment of a polar modulator arrangement according to FIGS. 1 and 2. In this embodiment a digital-to-analog converter 901 is coupled to the amplitude input MIN for receiving the processed digital amplitude component. Similar to the embodiment shown in FIG. 8, the arrangement comprises a phase-locked loop 902 coupled to the phase input PIN for providing a phase modulated or frequency modulated radio frequency signal which can be used as a modulated carrier signal. The output of the phase-locked loop 902 is coupled to a power amplifier 903 which further comprises a control input coupled to an output of the digital-to-analog converter 901.

In this embodiment the modulated carrier signal at the output of the phase-locked loop 902 is amplified by the power amplifier 903 depending on an amplification factor provided by the digital-to-analog converter 901. In other words, an amplitude modulation of the phase modulated or frequency modulated carrier signal is performed as a function of the digital amplitude component. As a result, the polar modulated radio frequency signal is generated at the output of the power amplifier 903 and provided to the modulator output MO.

FIG. 10 shows an exemplary embodiment of a polar modulation method. While the method and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

At S1 a first and a second component corresponding to a digital amplitude component and a digital phase component are received. A low-pass filtering of the first component and of the second component is performed at S2, wherein the low-pass filtering may be performed for different cut-off frequencies for the first and the second component.

At S3 an interpolated first component is generated by interpolating and filtering the first component. Additionally an interpolated second component can be generated by interpolating and filtering the second component. In various embodiments only the amplitude component can be filtered and interpolated or only the phase component is interpolated and filtered or both the amplitude component and the phase component are interpolated and filtered.

Interpolating and filtering the first component or the second component can comprise a respective notch filtering. In this case at least one notch frequency of the notch filtering can depend on a data rate of the respective digital component. A filter function of the notch filtering can depend on a $\sin(x)/x$ function in one embodiment.

When interpolating the first component and/or the second component a data rate of the respective component is increased. Therefore a data rate of the respective interpolated component is higher than a data rate of the respective component before interpolating and filtering.

At S4 a polar modulated radio frequency signal is generated as a function of the processed first component and of the second component, wherein at least one of the first and the second component is an interpolated component.

The polar modulated radio frequency signal can be generated by performing an amplitude modulation of a phase modulated carrier signal as a function of the interpolated components.

In another embodiment the polar modulated radio frequency signal is generated by generating an amplitude modulated signal as a function of the digital amplitude component, generating a phase modulated carrier signal as a function of the digital phase component and mixing the amplitude modulated signal with the phase modulated carrier signal.

By using the digital interpolation filters an unwanted repetition spectrum in the digital polar components can be attenuated or removed in the digital domain. Therefore an effort for analog filtering for removing the repetition spectrum can be decreased. Furthermore the digital concept is more insensitive to process, voltage and temperature (PVT) variation and time matching between the amplitude path and the phase path of the polar modulator arrangement.

For the interpolating and filtering, especially the notch filtering, also other filter types can be employed. Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A polar modulator arrangement, comprising:
    a first and a second node configured to receive a digital signal comprising a first and a second component corresponding to a digital amplitude component and a digital phase component;
    a first digital interpolation filter configured to generate an interpolated first component by interpolating and filtering the first component;
    a combination element configured to generate a polar modulated radio frequency signal as a function of the interpolated first component and of the second component; and a low-pass filter element configured to perform a low-pass filtering of the first component and of the second component.

2. The arrangement of claim 1, further comprising a second digital interpolation filter to generate an interpolated second component by interpolating and filtering the second component, wherein the combination element generates the polar modulated radio frequency signal as a function of the interpolated first component and the interpolated second component.

3. The arrangement of claim 1, wherein the first digital interpolation filter comprises a notch filter element.

4. The arrangement of claim 3, wherein at least one notch frequency of the notch filter element depends on a data rate of the first component.

5. The arrangement of claim 3, wherein a filter function of the notch filter element depends on a $\sin(x)/x$ function.

6. The arrangement of claim 3, wherein the notch filter element comprises at least one cascaded-integrated-comb filter.

7. The arrangement of claim 1, wherein a data rate of the interpolated first component is higher than a data rate of the first component.

8. The arrangement of claim 1, wherein the low-pass filter element comprises filters for different cut-off frequencies for the first and the second component.

9. The arrangement of claim 1, wherein the combination element comprises a phase locked loop to generate a phase modulated carrier signal as a function of the digital phase component.

10. The arrangement of claim 9, wherein the combination element generates the polar modulated radio frequency signal by performing an amplitude modulation of the phase modulated carrier signal as a function of the digital amplitude component.

11. The arrangement of claim 9, wherein the combination element generates the polar modulated radio frequency signal by generating an amplitude modulated signal as a function of the digital amplitude component and mixing the amplitude modulated signal with the phase modulated carrier signal.

12. The arrangement of claim 1, further comprising a Sigma-Delta-modulator coupling the first digital interpolation filter to the combination element.

13. The arrangement of claim 1, further comprising a conversion unit to derive the first and the second component as a function of input data to be modulated.

14. A polar modulator arrangement, comprising:
a first and a second node to receive a signal comprising a digital amplitude component and a digital phase component;
a first digital interpolation filter which is coupled to the first node with a first input and comprises a first output to provide an interpolated and filtered signal as a function of a signal at the first input;
a combination element comprising a first combination input which is coupled to the first output of the first digital interpolation filter and comprising a second combination input coupled to the second node, the combination element to generate a polar modulated radio frequency signal as a function of signals at its first and second combination input; and
a low-pass filter element configured between the first node and the first digital interpolation filter and between the second node and the second combination input, wherein the low-pass filter element performs low-pass filtering of the digital amplitude component and digital phase component.

15. The arrangement of claim 14, further comprising a second digital interpolation filter which is coupled to the second node with a second input and comprises a second output to provide a further interpolated and filtered signal as a function of a signal at the second input, the second output coupled to the second combination input.

16. The arrangement of claim 14, wherein the combination element comprises a second digital interpolation filter which is coupled to the second combination input with a second input and comprises a second output to provide a further interpolated and filtered signal as a function of a signal at the second input.

17. The arrangement of claim 14, wherein the first digital interpolation filter comprises a notch filter element.

18. The arrangement of claim 17, wherein at least one notch frequency of the notch filter element depends on a data rate of the first component.

19. The arrangement of claim 17, wherein a filter function of the notch filter element depends on a $\sin(x)/x$ function.

20. The arrangement of claim 17, wherein the notch filter element comprises at least one cascaded-integrated-comb filter.

21. The arrangement of claim 14, wherein the combination element comprises a phase modulator element and an amplitude modulator element which are coupled to the first and the second combination input, wherein the amplitude modulator element is further coupled to an output of the phase modulator element and the polar modulated radio frequency signal is provided at an output of the amplitude modulator element.

22. The arrangement of claim 14, further comprising a conversion unit, coupled on its input side to a data input and on its output side to the first and to the second node, the conversion unit to derive the amplitude component and the phase component as a function of input data provided at the data input.

23. A polar modulation method, comprising:
receiving a first and a second component corresponding to a digital amplitude component and a digital phase component;
low-pass filtering the digital amplitude component and the digital phase component;
generating an interpolated first component by interpolating and filtering the first component; and
generating a polar modulated radio frequency signal as a function of the interpolated first component and of the second component.

24. The method of claim 23, wherein an interpolated second component is generated by interpolating and filtering the second component and wherein the polar modulated radio frequency signal is generated as a function of the interpolated first component and of the interpolated second component.

25. The method of claim 23, wherein interpolating and filtering the first component comprises a notch filtering of the first component.

26. The method of claim 25, wherein at least one notch frequency of the notch filtering depends on a data rate of the first component.

27. The method of claim 25, wherein a filter function of the notch filtering depends on a $\sin(x)/x$ function.

28. The method of claim 23, wherein a data rate of the interpolated first component is higher than a data rate of the first component.

29. The method of claim 23, wherein the low-pass filtering is performed using different cut-off frequencies for the first and for the second component.

30. The method of claim 23, wherein the polar modulated radio frequency signal is generated by performing an amplitude modulation of a phase modulated carrier signal as a function of the interpolated first component and of the second component.

31. The method of claim 23, wherein the polar modulated radio frequency signal is generated by generating an amplitude modulated signal as a function of the digital amplitude component, generating a phase modulated carrier signal as a function of the digital phase component and mixing the amplitude modulated signal with the phase modulated carrier signal.

32. The method of claim 23, wherein generating the polar modulated radio frequency signal comprises Sigma-Delta-modulation of the interpolated first component.

33. The method of claim 23, wherein the first and the second component are derived as a function of input data to be modulated.

34. A polar modulator arrangement, comprising:
a first and a second node configured to receive a digital signal comprising a first and a second component corresponding to a digital amplitude component and a digital phase component;
a first digital interpolation filter configured to generate an interpolated first component by interpolating and filtering the first component;
a combination element to generate a polar modulated radio frequency signal as a function of the interpolated first component and of the second component;
wherein the first digital interpolation filter comprises a notch filter element configured to filter the first component prior to interpolating.

* * * * *